United States Patent
Rosales (10) Patent No.: US 10,345,367 B1
(45) Date of Patent: Jul. 9, 2019

(54) EXTERNALLY MOUNTABLE FAULT INDICATOR ASSEMBLIES FOR ELECTRICAL DEVICES, SYSTEMS INCORPORATING SAME, AND METHODS OF USING SAME

(71) Applicants: Weidmann Holding AG, Rapperswill (CH); Orto de Mexico, S.A. de C.V., Cuernavaca (MX)

(72) Inventor: Jorge Gonzalez de la Vega Rosales, Cuernavaca (MX)

(73) Assignees: Orto de Mexico, S.A. de C.V., Ocotepec, Cuernavaca, Morelos (MX); Weidmann Holding AG, Rapperswil (CH)

( * ) Notice: Subject to any disclaimer, the term of this patent is extended or adjusted under 35 U.S.C. 154(b) by 0 days.

(21) Appl. No.: 16/177,953

(22) Filed: Nov. 1, 2018

(51) Int. Cl.
| G01R 31/00 | (2006.01) |
| G01R 31/12 | (2006.01) |
| G01R 31/02 | (2006.01) |

(52) U.S. Cl.
CPC ....... *G01R 31/1281* (2013.01); *G01R 31/027* (2013.01); *G01R 31/028* (2013.01)

(58) Field of Classification Search
USPC .................. 324/509, 512, 547, 556; 73/1.71
See application file for complete search history.

(56) References Cited

U.S. PATENT DOCUMENTS

| 5,078,078 | A | 1/1992 | Cuk |
| 6,429,662 | B1 | 8/2002 | Cuk et al. |
| 6,812,713 | B2 | 11/2004 | Cuk et al. |
| 6,949,934 | B1 * | 9/2005 | Vu .......................... H01F 27/40 324/547 |
| 2013/0074603 | A1 * | 3/2013 | Pezzin ................... G01L 23/00 73/716 |

FOREIGN PATENT DOCUMENTS

WO          2016134458 A1    9/2016

* cited by examiner

*Primary Examiner* — Vincent Q Nguyen
(74) *Attorney, Agent, or Firm* — Downs Rachlin Martin PLLC (57) ABSTRACT

Fault-indicator assemblies that can each be mounted externally to a corresponding electronic device to provide a visual indication that an internal fault has occurred within the electronic device. A fault-indicator assembly of the present disclosure can be configured for electrical devices such as electrical power transformers, capacitors, and reactors, among others. Some embodiments can be configured to connect to existing orifices of a conventionally manufactured electronic device, such as an orifice for a conventional pressure-relief valve. Such embodiments can be deployed without any modifications to the electrical devices and can be readily retrofitted to existing electrical devices. In some embodiments, a pressure-relief valve can be integrated with the fault-indicator assembly to provide both fault-indication functionality and pressure-relief functionality in the same assembly.

20 Claims, 7 Drawing Sheets

EXTERNALLY MOUNTABLE FAULT INDICATOR ASSEMBLIES FOR ELECTRICAL DEVICES, SYSTEMS INCORPORATING SAME, AND METHODS OF USING SAME

FIELD OF THE DISCLOSURE

The present disclosure generally relates to the field of electrical device fault indicators. In particular, the present disclosure is directed to externally mountable fault indicator assemblies for electrical devices, systems incorporating same, and methods of using same.

BACKGROUND

Electrical power distribution grids use electrical devices, such as transformers, capacitors and reactors to control the power on the network. Dangerous conditions can be created in such electrical devices when aging or operating stresses cause the insulation system to fail. A short circuit within such an electrical device can release a large amount of energy within a fraction of a second. In the worst case, the electrical device can explode due to rapid pressure surges from the vaporizing of the insulating oil and the decomposition of the oil vapor into combustible gases. Some electrical devices are filled with electrically insulating gases such as sulfur hexafluoride. In such gas-filled devices arcing can cause pressure surges in the gas.

Unfortunately, an internal fault within an electrical device may occur without providing a visible sign to the outside. Unless service personnel can tell that a particular device has failed, they may re-apply power to the device without detecting that a failure has occurred, exposing them to the significant risk that the electrical device could explode when reenergized and the fault reoccurs and generates a high internal pressure.

SUMMARY OF THE DISCLOSURE

In one implementation, the present disclosure is directed to a fault-indicator assembly for an electrical device that includes a housing defining an interior space that contains electrical components, wherein the housing includes an orifice in fluid communication with the interior space, and a fault within the electrical components causes a pressure rise within the interior space. The fault-indicator assembly includes a visual indicator changeable between a non-fault-indicating state and a fault-indicating state, wherein, once the visual indicator has changed from the non-fault-indicating state to the fault-indicating state due to increase in pressure within the interior space of the housing of the electrical device, the visual indicator remains in the fault-indicating state after the pressure has subsided; a pressure-activated actuator operatively coupled to the visual indicator, the pressure-activated actuator configured, when the fault-indicator assembly is deployed exteriorly to the electrical device, to cause the visual indicator to change to the fault-indicating state in response to an increase in pressure within the interior space of the electrical device equaling a preset pressure; and a connecting structure configured to locate the fault-indicator assembly exteriorly to the housing of the electrical device, the connecting structure having a fluid passageway that, when the fault-indicator assembly is deployed exteriorly to the electronic device, fluidly couples the pressure-activated actuator to the interior space of the electrical device via the orifice.

In another implementation, the present disclosure is directed to a fault-indicator assembly for an electrical device that includes a housing defining an interior space that contains electrical components, wherein the housing includes an orifice in fluid communication with the interior space, and a fault within the electrical components causes an overpressure within the interior space. The fault-indicator assembly includes a visual indicator movable between a non-fault-indicating position and a fault-indicating position, wherein, once the visual indicator has moved from the non-fault-indicating position to the fault-indicating position due to increase in pressure within the interior space of the housing of the electrical device, the visual indicator remains in the fault-indicating position after the pressure has subsided; a catch operatively engaged with the visual indicator, the catch maintaining the visual indicator in the non-fault-indicating position until triggered to release the visual indicator; a trigger operatively engaged with the catch so as to release the catch in response to the trigger being triggered; a pressure-activated actuator in operative communication with the trigger, the pressure-activated actuator configured to actuate the trigger, when the fault-indicator assembly is deployed on the electrical device, in response to an increase in pressure within the interior space of the electrical device; a connecting structure configured to locate the fault-indicator assembly exteriorly to the housing of the electrical device, the connecting structure having a fluid passageway that, when the fault-indicator assembly is deployed with the electronic device, fluidly couples the pressure-activated actuator to the interior space of the electrical device via the orifice; a pressure-relief valve in fluid communication with the connecting structure; and a housing that contains the pressure-activated actuator, the catch, the trigger, and, when the visual indicator is in the non-fault-indicating position, a portion of the visual indicator that is located outside of the housing when the visual indicator is in the fault-indicating position.

In still yet another implementation, the present disclosure is directed to a fault-indicator assembly for an electrical device that includes a housing defining an interior space that contains electrical components, wherein the housing includes an orifice in fluid communication with the interior space, and a fault within the electrical components causes a pressure rise within the interior space. The fault-indicator assembly includes a communication module configured to transmit a notification signal to a network; a communication trigger in operative communication with the communication module and configured to communicate one or more signals to the communication module that cause the communication module to transmit the notification signal in response to pressure within the interior space of the electrical device equaling or exceeding a trigger pressure of the fault-indicator assembly; a pressure-activated actuator configured, when the fault-indicator assembly is deployed exteriorly to the electrical device, to cause the communication trigger to communicate the one or more signals to the communication module based on the pressure within the interior space of the electrical device equaling or exceeding the trigger pressure; and a connecting structure configured to locate the fault-indicator assembly exteriorly to the housing of the electrical device, the connecting structure having a fluid passageway that, when the fault-indicator assembly is deployed exteriorly to the electronic device, fluidly couples the pressure-activated actuator to the interior space of the electrical device via the orifice.

BRIEF DESCRIPTION OF THE DRAWINGS

For the purpose of illustrating the disclosure, the drawings show aspects of one or more embodiments of the disclosure.

However, it should be understood that the present disclosure is not limited to the precise arrangements and instrumentalities shown in the drawings, wherein.

DETAILED DESCRIPTION

In some aspects, the present disclosure is directed to a fault-indicator assembly that indicates when an electrical device has experienced an internal fault that manifests itself as an abnormal pressure rise within the electrical device. Such a fault-indicator assembly is particularly useful for oil-filled and gas-filled electrical devices, such as transformers, capacitors, and reactors, used on power-distribution networks and the like. A fault-indicator assembly of the present disclosure provides a visual indication that the internal pressure of the electrical device has reached a predetermined level indicative of an internal fault having occurred. An example of an internal fault that can cause a relatively high pressure inside an oil-filled electrical device is an internal arcing fault that produces a large temperature increase that vaporizes some of the oil. In a gas-filled electrical device, such as an electrical device filled with electrically insulating sulphur hexafluoride, internal arcing causes pressure surging within the gas.

Figure 1:
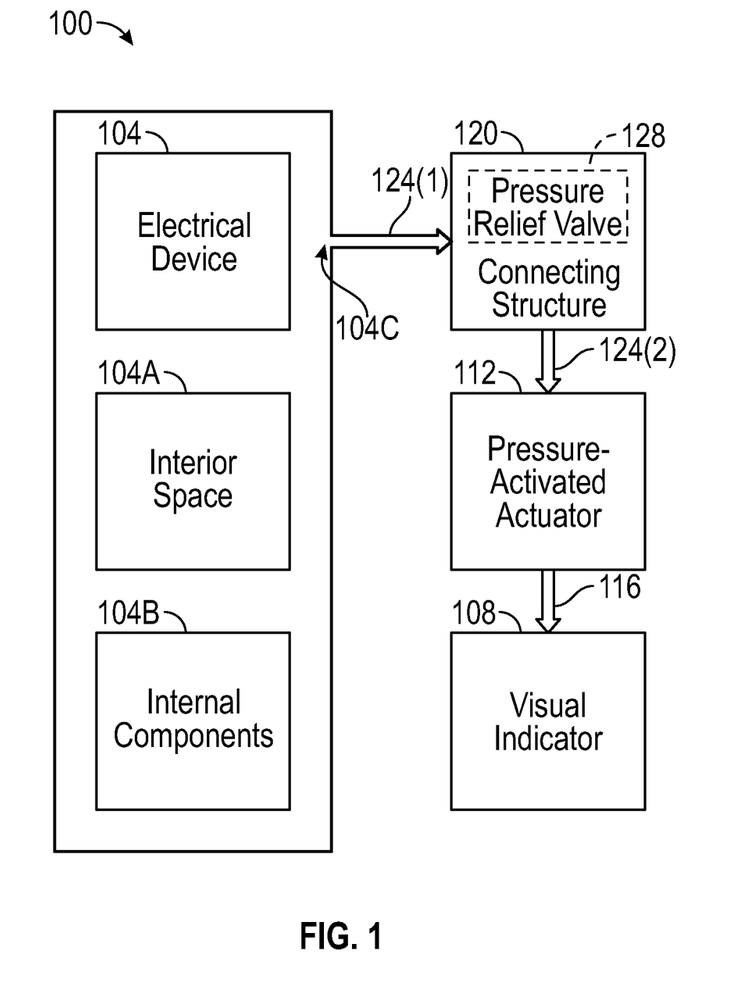
FIG. 1 is a schematic diagram of a fault-indicator assembly made in accordance with the present disclosure.

Referring to the accompanying drawings, FIG. 1 illustrates an example fault-indicator assembly 100 of the present disclosure located externally to, and fluidly connected to, an electrical device 104, which may be any electrical device, such as a transformer, capacitor, or reactor, filled with an insulating fluid, for example, oil or gas. Electrical device 104 includes an interior space 104A that contains various internal components 104B, including but not limited to electrical windings and/or other electrical conductors and insulation, such as insulation paper and/or insulation boards, among other things. Those skilled in the art will be familiar with the components that make up internal components 104B of electrical device 104, depending on the type of the electrical device.

In this example, fault-indicator assembly 100 includes a visual indicator 108 that is controlled by a pressure-activated actuator 112 via an actuation coupling 116. Pressure-activated actuator 112 is fluidly coupled to interior space 104A of electrical device 104 via a connecting structure 120, as indicated by arrows 124(1) and 124(2) that denote conveyance of pressure from, respectively, the internal space to the connecting structure and from the connecting structure to the pressure-activated actuator. Consequently, when pressure changes within interior space 104A, both connecting structure 120 and pressure-activated actuator 112 also experience a pressure change. Depending on the magnitude of the pressure within interior space 104A and experienced by pressure-activated actuator 112, the pressure-activated actuator controls the visual-indication state of visual indicator 108.

Visual indicator 108 and pressure-activated actuator 112 are selected and designed in conjunction with one another so that fault-indicator assembly 100 provides persistent fault-indicating functionality that signals that a triggering pressure level has occurred even when the pressure has subsequently decreased below the triggering pressure level. In this example, visual indicator 108 may be considered to have two states—a non-fault-indicating state and a fault-indicating state—and these states may take any of a variety forms. For example, in some embodiments, the non-fault-indicating and fault indicating states may be based on one or more illumination sources, such as one or more light-emitting diodes. In one example that uses a pair of illumination sources, the non-fault-indicating state may be one of the illumination sources emitting green light and the fault-indicating state may be the other of the illumination sources emitting red light. In another example using a single illumination source, the non-fault-indicating state may be the illumination source not emitting any light and the fault-indicating state may be the illumination source emitting red light. In each of these examples, pressure-activated actuator 112 may be a pressure transducer that generates electrical non-fault and fault signals for controlling the illumination of the illumination source(s). Such a pressure transducer may be based on any suitable pressure-activate device, such as a bellows (see detailed example below), a Bourdon tube, or a diaphragm, among others. Visual indicator 108 and/or pressure-activated actuator 112 may be configured so that even when the pressure that caused the visual indicator to change to the fault-indicating state reduces or is reduced, the visual indication remains in the fault-indicating state. This allows an observer to know that electrical device 104 may be damaged and require fixing or replacement before reenergizing. In these examples, actuation coupling 116 comprises the electrical signals for illuminating the illumination source(s).

In some embodiments, visual indicator 108 may be a mechanical device for which the non-fault-indicating and fault-indicating states correspond to differing positions of one or more movable members of the mechanical device. For example, the mechanical device may be a dial-gage-like device having a movable needle that is movable between a non-fault-indicating position and a fault-indicating position. In this example, the needle may be moved by a Bourdon tube (i.e., pressure-activated actuator 112) as pressure within the Bourdon tube increases. The dial-gage-like device may have a dial marked with a red zone, and if the needle is in the red zone, an observer would know that electrical device may be damaged. In this example, the needle moves in only one direction—toward and/or into the red zone—by virtue of the Bourdon tube only being able to push the needle to move it. This provides the persistent indication that a fault-level pressure occurred even though the pressure may have subsequently reduced to a normal level. The needle may be secured to a pivot so as to have enough friction with the pivot to remain in the position the Bourdon tube has pushed it to after the Bourdon tube has relaxed. This dial-gage-like device may be in the form of a rotary dial or a linear dial and may have a moveable member other than a needle. This sort of device may be considered non-binary, since the movable member can be moved with any pressure increase, and not just pressure increases that move the movable member into the red zone. In this example, actuation coupling 116 comprises the engagement of the Bourdon tube with the movable member.

Another example of a mechanical device that can be used for visual indicator 108 is a plunger-style device having a plunger-like elongate body that is longitudinally movable between a non-fault-indicating position (a/k/a state) and a fault-indicating position (a/k/a state) within a corresponding receiver. In one example, the operation of the elongate body is binary in nature, with the non-fault-indicating position being a position in which the elongate body is fully retracted into the receiver and the fault-indicating position being a position in which the elongate body fully extended out of the receiver. An example of a plunger-style version of visual indicator 108 is described below in detail in conjunction with FIGS. 3A to 5. In some embodiments, the elongate body may be held in the non-fault-indicating position by a catch while being biased, for example, by one or more springs, one or more elastic bands, gravity (e.g., with a downwardly moving elongate body), etc., toward the fault-indicating position. In such embodiments, a trigger actuated by pressure-activated actuator 112 causes the catch to release, which in turn allows the elongate body to move under influence of the biasing. In these embodiments, pressure-activated actuator 112 may be of any suitable type, such as a deformable type that deforms either continuously with changing pressure or suddenly when the pressure reaches a trigger pressure. This deformation moves the trigger, which in turn releases the catch and allows the elongate body to move under influence of the biasing. It is noted that the trigger may be a separate member or structure relative to pressure-activated actuator 112 and the catch. However, it could also be integrated into either the pressure-activated actuator 112 or the catch. For example, the trigger may simply be a protrusion or other structure on the catch that pressure-activated actuator contacts directly to release the catch. In this example, actuation coupling 116 comprises the trigger and corresponding catch. Other embodiments are certainly possible.

In another example of a plunger-style visual indicator 108, the elongate body may be held in the non-fault indicating position by friction, for example, with a sleeve or O-ring seal located between the end of a housing near the end of the elongate body that extends from the housing when the visual indicator has been triggered. In this example, the elongate body may be pushed from the non-fault indicating position to the fault-indicating position by a diaphragm moved by a differential pressure between interior space 104A of electrical device 104 and ambient pressure outside of the electrical device. Such diaphragm may act against a spring calibrated to the appropriate pressures. In this example, once the diaphragm has pushed the plunger-type visual indicator 108 to the extended fault-indicating position, it remains in that position by virtue of the friction noted above even though the diaphragm may have retracted because of subsequent reduction of pressure within interior space 104A of electrical device.

Connecting structure 120 allows fault-indicator assembly 100 to be located externally to electrical device 104 and provides a fluid passageway between interior space 104A of the electrical device and pressure-activated actuator 112, for example, via an orifice 104C. In a simple form, connecting structure 120 may be a rigid or flexible conduit that provides the fluid passageway. In an even simpler form, connecting structure 120 may consist essentially of a connection fitting that makes a direct fluid connection of pressure-activated actuator 112 to electrical device 104. If connecting structure 120 includes an elongate conduit, pressure-activated actuator 112 may be located at least somewhat distally from electrical device 104 or in a location spaced from orifice 104C, if desired. For example, if orifice 104C is located where insufficient clearance exists to locate pressure-activated actuator 112 there, or where an observer could not readily view visual indicator 108, then providing connecting structure 120 with a sufficiently long conduit would allow pressure-activated actuator 112 and visual indicator 108 to be located remotely from orifice 104C.

In one example, orifice 104C is threaded. In this example, connecting structure 120 can have a threaded end threaded to threadedly engage threaded orifice 104C so that the connecting structure can be connected to electrical device 104. It is noted that some electrical devices, such as transformers, are currently manufactured with pressure-relief-valve orifices that receive corresponding respective conventional pressure-relief valves. Consequently, in some embodiments, the end of connecting structure 120 may be adapted for these specific conventional orifices.

In this connection, connecting structure 120 may itself optionally include, or otherwise fluidly communicate with, a pressure-relief valve 128. In embodiments of fault-indicator assembly 100 adapted to engage a conventional pressure-relief-valve orifice, pressure-relief valve 128 replaces a conventional pressure-relief valve. This allows existing and conventionally manufactured electrical devices having such orifices to be easily retrofitted with external fault-indicator assemblies made in accordance with the present disclosure. This is in stark contrast with conventional fault indicators that require pressure-sensing components to be located within the interior space of the electrical device. Consequently, conventional fault indicators are not readily retrofitted into existing and conventionally manufactured electrical devices.

Figure 2:
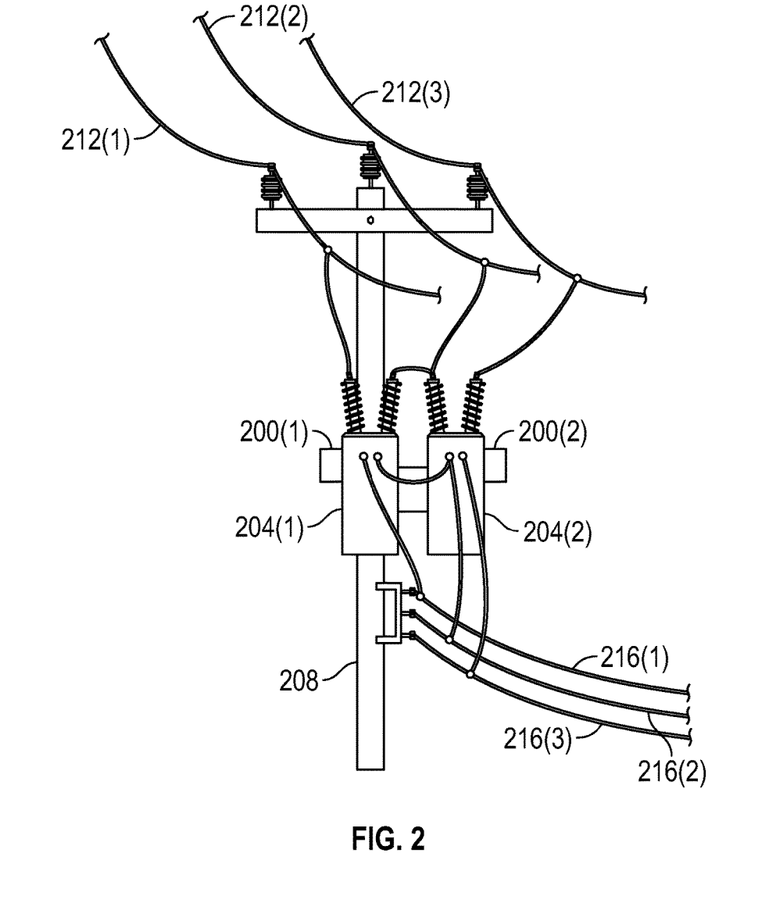
FIG. 2 is a partial elevational view of a pair of pole-mounted stepdown transformers that each include an externally mounted fault-indicator assembly made in accordance with the present disclosure.

FIG. 2 illustrates a pair of fault-indicator assemblies 200(1) and 200(2) deployed on the exteriors of corresponding respective electrical transformers 204(1) and 204(2). In this example, each fault-indicator assembly 200(1), 200(2) may be identical to fault-indicator assembly 100 of FIG. 1. In this example, transformers 204(1) and 204(2) are mounted to a utility pole 208 and deployed as three-phase stepdown transformers that stepdown the voltage on higher-voltage lines 212(1) to 212(3) to provide lower-voltage lines 216(1) to 216(3) with a lower voltage. As noted above, electrical transformers, here electrical transformers 204(1) and 204(2), are just one example of electrical devices that can benefit from fault-indicator assemblies of the present disclosure.

Example Fault-Indicator Assembly

Figure 3A:
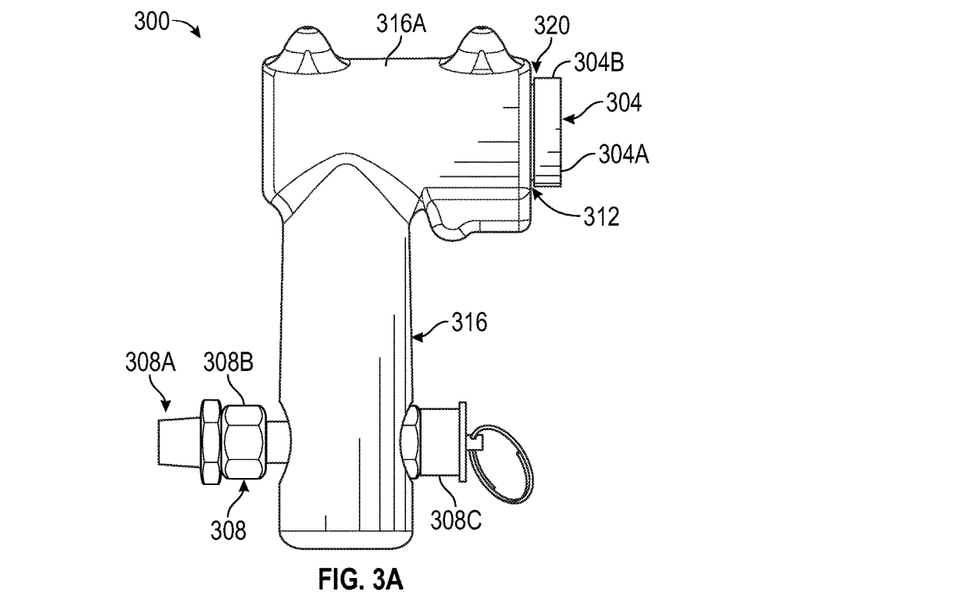
FIG. 3A is a side elevational view of an example instantiation of a fault-indicator assembly made in accordance with the present disclosure, showing the visual indicator in a non-fault-indicating position.

FIGS. 3A to 5 illustrate a fault-indicator assembly 300 that is a specific instantiation of fault-indicator assembly 100 depicted in FIG. 1. Referring first to FIG. 3A, fault-indicator assembly 300 includes a visual indicator 304 and a connecting structure 308 that has a connection end 308A in the form of a connection fitting 308B. In this example, connection fitting 308B is a threaded fitting particularly configured to threadingly engage a mating threaded orifice (not shown) in a wall of an electrical device (not shown). Fault-indicator assembly 300 also includes an integrated pressure-relief valve 308C, which, here, is integrated with connecting structure 308. Visual indicator 304 comprises an elongate body 304A slidably engaged within a corresponding receiver 312 provided within a housing 316. FIG. 3A shows visual indicator 304 fully retracted into elongate body receiver 312, with only a headed end 304B showing on the outside of fault-indicator assembly 300. This fully retracted position of visual indicator 304 is the non-fault-indicating position 320 (a/k/a state) of the visual indicator. In this example, visual indicator 304 remains in non-fault-indicating position 320 as long as the pressure within an interior region of an electrical device (not shown) on which fault-indicator assembly 300 is deployed does not cause the pressure within the fault-indicator assembly to equal or exceed a predetermined triggering pressure of the fault-indicator assembly.

Figure 3B:
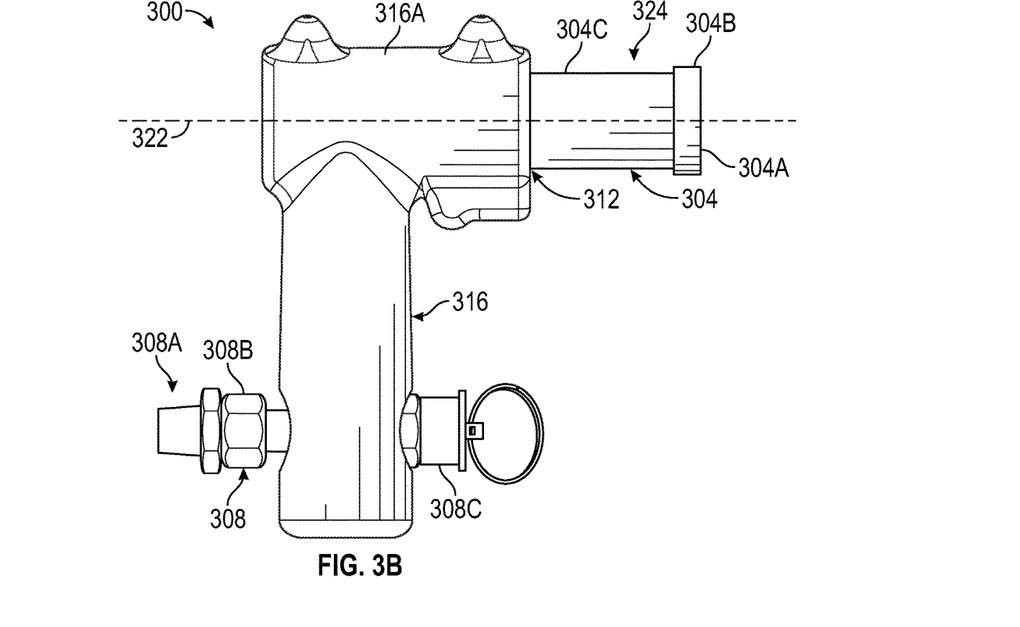
FIG. 3B is a side elevational view of the fault-indicator assembly of FIG. 3A, showing the visual indicator in a fault-indicating position.

FIG. 3B, on the other hand, shows visual indicator 304 fully extended from receiver 312 along a longitudinal axis 322, revealing to an observer a previously concealed portion 304C of the visual indicator. This fully extended position of visual indicator 304 is the fault-indicating position 324 (a/k/a state) of the visual indicator. As described below in detail, visual indicator 304 changes position from non-fault-indicating position 320 to fault-indicating position 324 based on the pressure within the interior space of the electrical device (not shown) causing the pressure within fault-indicator assembly 300 to equal or exceed the predetermined triggering pressure of the fault-indicator assembly. Once visual indicator 304 is in fault-indicating position 324, it remains in this position even if the pressure within fault-indicator assembly 300 falls below the predetermined triggering pressure. This allows an observer to see that the electrical device (not shown) has experienced an elevated internal pressure indicative of a fault having occurred, regardless of how long it has been since the fault occurred and regardless of the current pressure within the electrical device. Seeing visual indicator 304 in its fault-indicating position 324 is a signal to an observer that the electrical device should not be reenergized before it is inspected, repaired, and/or replaced. While visual indicator 304 provides visual indication of an internal fault within the electrical device merely by virtue of its extension from receiver 312, in some embodiments previously concealed portion 304C can be colored or otherwise marked to make observation easy. For example, previously concealed portion 304C can be colored red, yellow, orange, or other bright color so that visual indicator is easily viewable. In some embodiments, a user can reset fault-indicator assembly 300 by pushing visual indicator 304 back into receiver 312 when the pressure within the fault-indicator assembly is suitably low.

In this example, housing 316 contains not only receiver 312 but also a pressure-activated actuator 328 (see FIG. 4) and a portion of connecting structure 308, among other things. In this manner, housing 316 effectively makes fault-indicator assembly 300, including pressure-relief valve 308C, into a robust unitary device. Housing 316 may be made of any suitable material(s), such as plastic, fiber-reinforced composite, and/or metal, among others. As seen when viewing either of FIGS. 3A and 3B in conjunction with FIG. 4, housing 316 in this example is a two-part housing comprising a first half 316A (FIGS. 3A and 3B) and a second half 316B (FIG. 4) that are joined together via fasteners (not shown) that extend through fastener openings 332 (FIG. 4) on the second half and into corresponding receivers (not shown) on the first half to join the two halves to one another.

Figure 4:
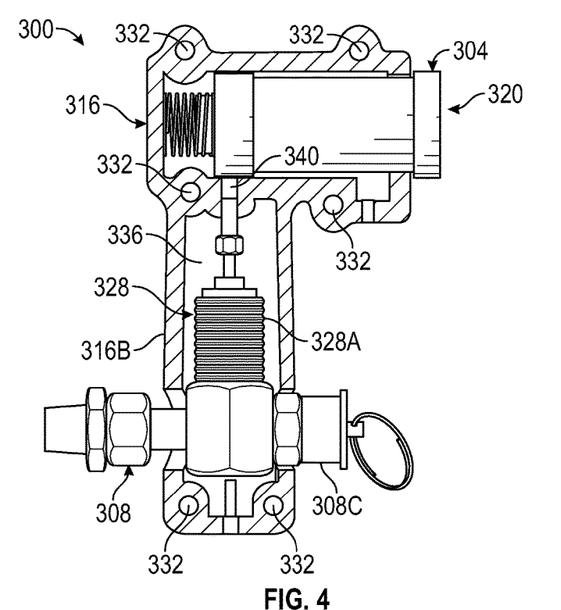
FIG. 4 is a side elevational view of the fault-indicator assembly of FIGS. 3A and 3B, showing a part of the housing removed to reveal interior components.

FIG. 4 shows components of fault-indicator assembly 300 of FIGS. 3A and 3B located within housing 316. Referring to FIG. 4, in this example pressure-activated actuator 328 has an expandable body 328A, here, a bellows, having an interior (not shown) that is fluidly coupled to the interior space (not shown) of an electrical device through connecting structure 308 and therefore is subjected to effectively the same pressure that is in the interior space. The pressure differential between the interior of expandable body 328A and the space 336 within housing 316 in which the expandable body is located causes the expandable body to expand or contract depending on the pressure differential between the two spaces. Not seen in FIG. 4 is the fluid passageway internal to connecting structure 308 that fluidly connects both the interior of expandable body 328A and pressure-relief valve 308C to the interior space (not shown) of an electrical device when fault-indicator assembly 300 is connected to the electrical device via connecting structure 308.

Figure 5:
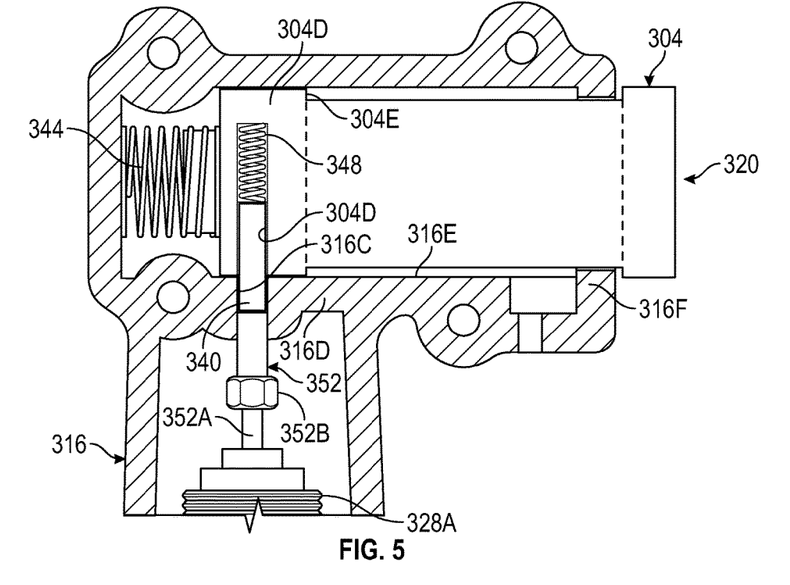
FIG. 5 is an enlarged view of a portion of the side elevational view of FIG. 4.

Referring to FIGS. 4 and 5, in this example, when the pressure within expandable body 328A is suitably low, visual indicator 304 is held in its non-fault-indicating position 320 (also FIG. 3A) by a catch 340, here, a shear pin that extends through an aperture 316C (FIG. 5) in wall 316D (FIG. 5) of housing 316 and into a receiver 304D (FIG. 5) within the visual indicator. Visual indicator 304 is biased in a direction toward fault-indicating position 324 (FIG. 3B) by a biasing means 344, here a single helical spring compressed between housing 316 and visual indicator 304. More than one spring can be used. Biasing means 344 need not be a helical spring, but rather could be, among other things another type of spring, another type of resilient member (e.g., elastomeric member), or gravity. Gravity can be used as biasing means 344 if, for example, fault indication assembly 300 is mounted so that visual indicator 304 moves vertically downward from its non-fault-indicating position 320 to its fault-indicating position 324 (i.e., when the fault-indicator assembly is rotated 90° clockwise relative to the orientation shown in FIGS. 3A to 5). It is noted that catch 340 need not necessarily be a shear pin, and can alternatively be any other suitable structure that releasably holds visual indicator 304 and/or biasing means 344.

As best seen in FIG. 5, the shear pin (i.e., catch 340) is biased toward aperture 316C by a biasing means 348, here a helical spring. Another type of biasing means can be used for biasing means 348, including any of the biasing means noted above for biasing means 344. When catch 340 is in registration with aperture 316C and the pressure within expandable body 328A is suitably low, biasing means 348 urges the catch into the aperture, thereby allowing the catch to act as a shear pin between visual indicator 304 and wall 316D so as to hold the visual indicator in its non-fault-indicating position 320.

As also best seen in FIG. 5, in this example fault-indicator assembly 300 includes a trigger 352 coupled to and moved by expandable body 328A. As expandable body 328A expands upwardly (relative to FIG. 5), it moves trigger 352 upward, which in turn pushes catch 340 upward. When the pressure within expandable body 328A is great enough and therefore expands enough, the contacting end surfaces of catch 340 and trigger 352, respectively, align horizontally (relative to FIG. 5) with the sliding interface between end 304E of visual indicator 304 and interior surface 316E of wall 316D. When this alignment occurs, catch 340 is disengaged from aperture 316C and therefore releases visual indicator 304, and biasing means 344 urges the visual indicator to its fault-indication position 324 (FIG. 3B). In this example, end 304E of visual indicator 304 has a shoulder 304F that engages an end wall 316F of housing 316 to keep biasing means 344 from pushing the visual indicator out of receiver 312. Also in the example, trigger 352 includes a threaded shaft 352A and a threaded adjuster 352B that allows a user to adjust the pressure at which catch 340 is released. Screwing threaded adjustor 352B farther onto threaded shaft 352A results in trigger 352 releasing catch 340 at a higher pressure, and screwing the threaded adjustor in the opposite direction results in the trigger releasing the catch at a lower pressure. In one instantiation in which expandable body 328A was a bellows having an equilibrium volume of 9.01 cm$^3$, the bellows was configured so that it deformed under pressure as illustrated in the following Table I.

TABLE I

| Pressure (psi) | Displacement (mm) |
|---|---|
| 4.5 | 1.12 |
| 6.0 | 2.34 |
| 8.0 | 4.14 |
| 9.0 | 4.79 |

Regarding triggering pressure, for many oil-filled transformers used for power distribution, conventional pressure-relief valves are typically set to trigger at 10 psi. For these applications, pressure-relief valve 308C (FIGS. 3A to 4) may be similarly configured to trigger at 10 psi. In such an application, fault-indicator assembly 300 is connected to a transformer so that expandable body 328 is in fluid communication with the gas space above the oil level within the interior space of the transformer.

In one example of a wide calibration, expandable body 328 and threaded adjuster 352B are configured and adjusted to trigger catch 340 to release visual indicator 304 at 9 psi, which is before pressure-relief valve 308C starts releasing pressure at 10 psi. In this manner, fault-indicator assembly 300 can detect slow and accumulative pressure increase caused by low energy arcs (partial discharge failure mode of the transformer).

In an example of a reduced calibration, expandable body 328A and threaded adjustor 352B are configured and adjusted to trigger catch 340 to release visual indicator 304 at 11 psi, which is after pressure-relief valve 308C starts releasing pressure at 10 psi. At this pressure, pressure-relief valve 308C is already releasing pressure and fault-indicator assembly will need a pressure increase rate higher than the releasing pressure rate of the pressure-relief valve. This was tested in a laboratory, and it was found that a pressure rate of 3 psi/sec can be enough to trigger release of visual indicator 304 even if pressure-relief valve 308C is already releasing pressure. It is noted that the pressure rate may be different from 3 psi/sec if pressure-relief valve 308C is sized differently. However, IEEE standards require pressure-relief valve 308C to operate at 10 psi and a flow rate of 35 scfm, so a different pressure rate may not be needed. A reason for using the reduced calibration is to avoid a false operation in the case that the pressure increases due to temperature increase when the electrical device is overloaded (e.g., by oil expansion). This can cause the pressure to rise up to 9 psi. It is noted that the triggering pressure can be set to be equal to the release pressure of pressure-relief valve 308C, if desired.

Experimental Testing

Testing Procedure—Low-Energy Test

Figure 6:
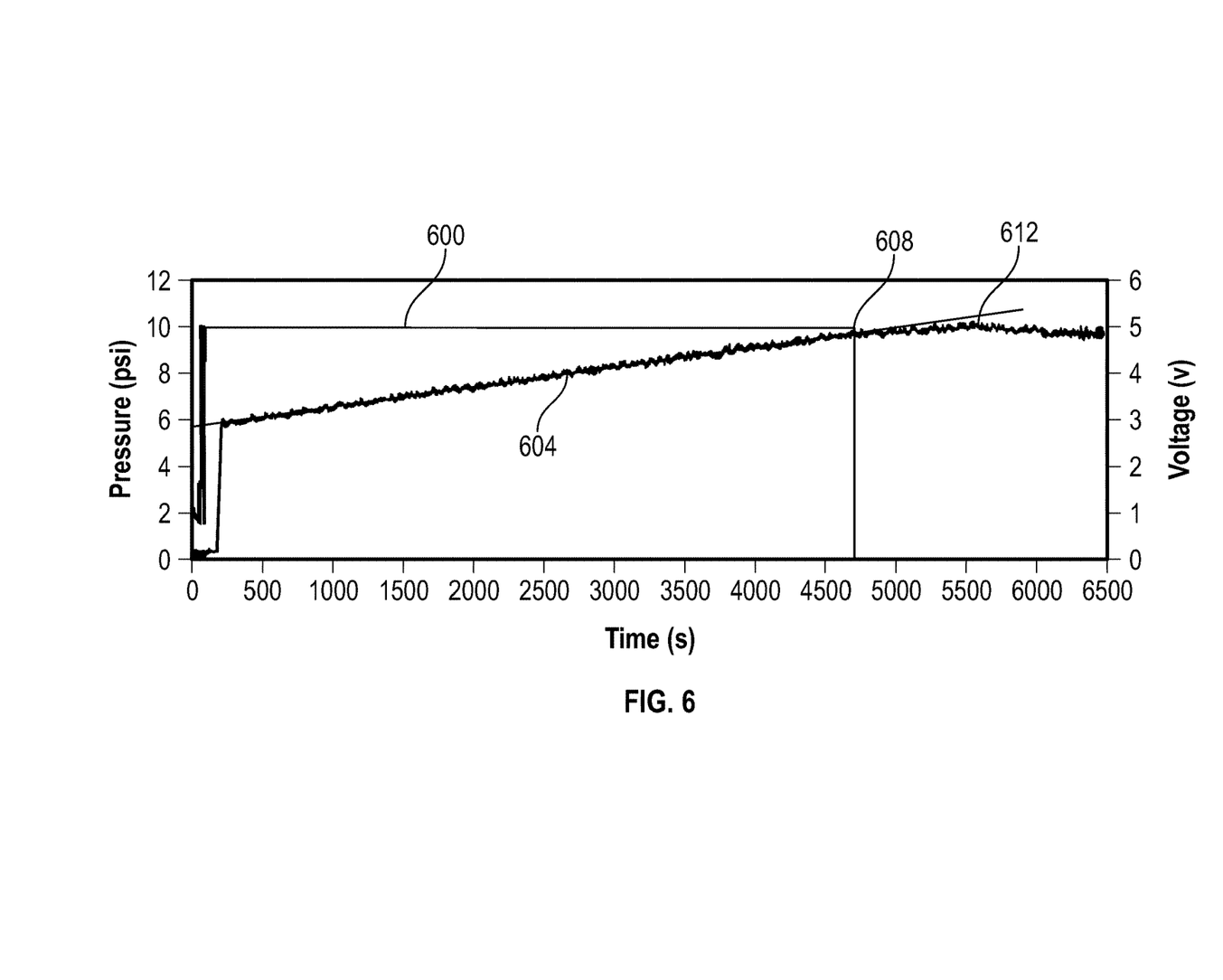
FIG. 6 is a graph of measured pressure and voltage over time during testing of the fault-indicator assembly of FIGS. 3A to 5.

An instantiation of fault-indicator assembly 300 of FIGS. 3A to 5 was mounted to a testing tank. A high-voltage transformer terminal was connected to a vertical electrode and ground was connected to a horizontal electrode. Then, an oil mixer was turned on. The transformer was energized and the voltage was regulated to a level of 5 kV to produce low energy arcing (approx. 1 Ampere) during a period of 10 seconds. The voltage was lowered and the transformer was de-energized. The procedure was repeated with consecutive cycles until the pressure was sufficient enough to trigger visual indicator 304 of fault-indicator assembly 300 and to operate pressure relief valve 308C, which was set to 10 psi. The pressure values were measured, recorded, and plotted during the test. FIG. 6 shows the pressure values, via pressure curve 600, measured over time during the test. Curve 604 displays the voltage over time during the test. In this test, the pressure rose approximately 0.053 psi/min. Pressure curve 600 shows, that the pressure gradually increased, simulating a high-impedance internal fault, such as a low energy partial arcing inside the transformer. Fault-indicator assembly 300 triggered visual indicator 304 at the calibration pressure of 9.5 psi, illustrated at point 608. This result demonstrates that fault-indicator assembly 300 is sensitive enough to detect this failure mode. Relief-valve operation triggered at a pressure of approximately 10.03 psi, as indicated at point 612.

High-Energy Tests

It is recognized that the test conditions that could simulate a high-energy arc inside a transformer should ultimately be described in terms of the energy applied, with the pressure wave defined by the rate of rise, length of the arc, peak pressure, duration, and total energy under the curve. In order to simulate a high-energy arc inside a transformer to perform the fault indicator tests, the test procedure described in IEEE Standard C57.12.20, Section 9 was used. This test procedure is not intended to include all possible conditions that may occur in service under fault conditions, but rather to establish a meaningful test that is repeatable and capable of duplication in various laboratories and test situations.

A simulated internal fault was provided for the test. This simulated fault consisted of a 25 mm (~1 in) arc gap mounted horizontally and located 25.4 mm (1 in) above core clamps. This gap was bridged initially by a copper wire that had a diameter smaller than 1.0 mm (0.0394 in or 18 AWG). The gap was connected between the high-voltage terminals. The mounting blocks or terminals of the gap consisted of copper-bearing material having flat surfaces from 6 mm to 20 mm (0.25 in to 0.75 in) in diameter or in width. These mounting blocks or terminals were designed to maintain this 25 mm (~1 in) arc gap for the duration of the testing. A transformer coil was not electrically connected in this test circuit. The power source was 7.2 kV and adjusted to supply the desired arc current. The above-identified Standard defines an arc current of 8000 A. However, various tests were performed at lower current values to find the sensitivity of fault-indicator assembly 300.

During the tests, fault-indicator assembly 300 was able to reliably trigger visual indicator 304 and signal the presence of an internal fault in a pole mounted distribution transformer. The test results validate that fault-indicator assembly 300 triggers visual indicator 304 and signals the presence of internal faults with currents as low as the ones shown in Table II below.

TABLE II

Applied Currents for High-Energy Tests

| Applied Current (A) | Test duration (mS) |
|---|---|
| 472 | 66.6 |
| 1024 | 33.3 |
| 1776 | 33.3 |
| 8000 (IEEE Standard Test) | 33.3 |

Example Fault-Indicator Assembly Having Remote Communication Functionality

Figure 7:
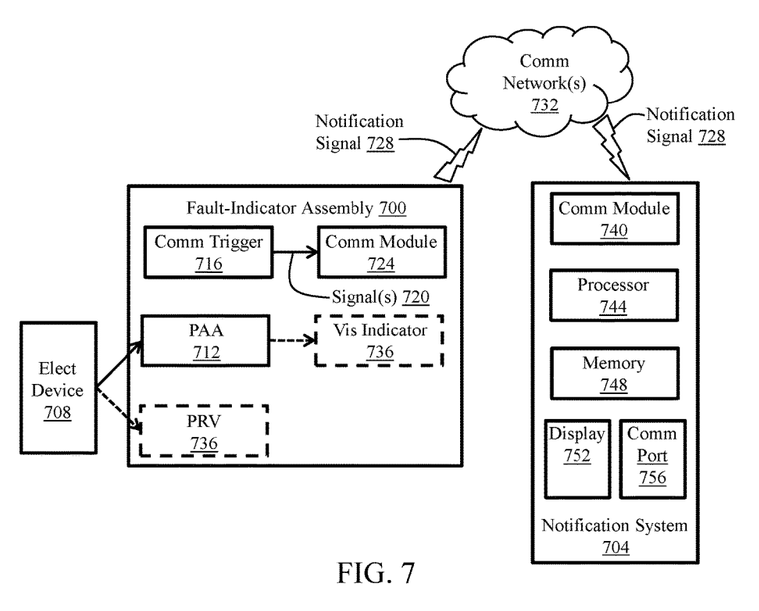
FIG. 7 is a high-level schematic diagram illustrating a fault-indicator assembly of the present disclosure configured to communicate with a remote notification system.

FIG. 7 illustrates an example fault-indicator assembly 700 that is able to communicate to a remotely located notification system 704 that the pressure inside an electrical device 708 has reached a level indicative of an internal fault having occurred within the electrical device. As noted above, both fault-indicator assembly 700 and electrical device 708 may be, respectively, the same as and/or incorporate the same or similar features as any of the fault-indicator assemblies and electrical devices described above.

In this example, fault-indicator assembly 700 includes a pressure-activated actuator (PAA) 712 that has the same or similar functions as described above relative to pressure-activated actuator 112 of FIG. 1 and can likewise be any suitable actuator or sensor responsive to pressure changes within the interior space of electrical device 708. In this example, pressure-activated actuator 712 of FIG. 7 causes, either directly or indirectly, a communication trigger 716 to send one or more signals 720 to a communication module 724 that cause the communication module to transmit a notification signal 728 to notification system 704 via one or more communication networks 732. As described below in more detail, notification signal 728 allows notification system 704 to notify one or more human users (not shown) and/or one or more external systems (not shown) that fault-indication assembly 700 has been triggered such that an internal fault may have occurred within electrical device 708.

Communication trigger 716 may be any suitable device or system that can generate signal(s) 720 for communication module 724 when fault-indicator assembly 700 has reached its triggering pressure based on pressure within internal space of electronic device 708. In one example, if pressure-activated actuator 712 comprises an electronic pressure sensor, then communication trigger 716 may comprise circuitry within, or in communication with, the electronic pressure sensor that generates signal(s) 720 when the electronic pressure sensor has reached the triggering pressure. As another example, if pressure-activated actuator 712 comprises a deformable component that deforms with changing pressure, such as occurs with a bellows, Bourdon tube, etc., the communication trigger 716 may comprise a switch that is actuated to send signal(s) 720 by movement of the deformable component. In the context of fault-indicator assembly 300 of FIGS. 3A to 5, when the triggering pressure is reached, expandable body 328A may push against a spring-loaded switch (not shown) that causes signal(s) 720 (FIG. 7) to be communicated to communication module 724. As another example in which pressure-activated actuator 712 comprises a deformable body, fault-indicator assembly 700 may be provided with a position sensor that can identify when the position of a portion of the deformable body moves to a position corresponding to the triggering pressure. Such a position sensor can be of any suitable type, such as mechanical, light-based and/or piezoelectric, among others.

In some embodiments, fault-indicator assembly 700 may optionally include a visual indicator 736, which can be the same as or similar to any one or more of the visual indicators described above relative to FIGS. 1 to 5. When visual indicator 736 is present and is of a movable type, such as visual indicator 304 of FIGS. 3A to 5 or the movable visual indicators described above relative to visual indicator 108 of FIG. 1, communication trigger 716, similar to the situation just described relative to a deformable body type of pressure-activated actuator 712, may be a switch or other type of position sensor that senses when the visual indicator is in its fault-indicating position. For example, fault-indicator assembly 300 of FIGS. 3A to 5 may be enhanced with a switch located on the inside of end wall 316F (FIG. 5) such that when visual indicator 304 has been triggered and shoulder 304F of end 304E of the visual indicator is moving toward end wall 316F of housing 316, the shoulder impacts upon the switch, thereby activating it. Many other alternatives are possible. In addition, depending on the configurations and presence of any trigger and catch, such as trigger 352 and catch 340 of FIG. 5, either or both of those may be used for triggering communication trigger 716. In this case, communication trigger 716 may be, for example, a switch or other position sensor responsive to the position of either the trigger or catch, or both.

Fault-indicator assembly 700 of FIG. 7 may optionally include a pressure-relief valve (PRV) 736. Pressure-relieve valve 736 may be the same as or similar to any of the pressure-relief valves described above, such as pressure-relief valve 128 of FIG. 1 and pressure-relief valve 308C of FIGS. 3A to 5. Pressure-relief valve 736 may be configured to additionally or alternatively cause communication trigger 716 to send signal(s) to communication module 724.

Communication module 724 may be any suitable wired or wireless communications device, such as a wireless radio-frequency transmitter or transceiver (e.g., a transmitter or transceiver that transmits using an IEEE 802.11 protocol), an optical transmitter or transceiver (e.g., a transmitter or receiver that transmits either in open air or via an optical fiber), or a wired transmitter or transceiver that transmits analog or digital signals over a communication cable, among others. Fundamentally, there are no limitations on the type of communication module 724 and the communication protocol used, as long as they are compatible with communication network(s) 732.

Communication network(s) 732 may be composed of any one or more networks that can carry notification signal 728 from communication module 724 to a communication module 740 of notification system 704. Examples of such communication networks include, but are not limited to, local-area networks, wide-area networks, global networks (e.g., the Internet), cellular communication networks, microwave communication networks, radio-frequency networks, optical communication networks, electrical power networks, and/or wired telephone communication networks, among many others. Fundamentally, there are no limitations on the type and number of networks that can compose communication network 732 other than it/they can communicate notification signal 728 from communication module 724 of fault-indicator assembly 700 to communication module 740 of notification system 704.

In addition to communication module 740 that receives notification signal 728, notification system 704 may include one or more processors (collectively represented at processor 744), one or more memories (collectively represented as memory 748), one or more displays (collectively represented as display 752), and one or more communication ports (collectively represented as communication port 756), among other things. Memory 748 is in operative communication with processor 744 and containing machine-executable instructions (not shown) for, among other things, executing algorithms and associated tasks for carrying out the functionalities described herein. Those skilled in the art will readily understand how to embody such algorithms based on the present functional descriptions such that further explanation is not required for those skilled in the art to understand how to execute all aspects of this disclosure.

Processor 744 may comprise any one or more processing devices, such as one or more microcontrollers, one or more central processing units, one or more processing cores of a system on a chip, one or more processing cores of an application specific integrated circuit, and/or one or more field programmable gate arrays, among others. Memory 748 can be any type(s) of suitable machine memory, such as cache, RAM, ROM, PROM, EPROM, and/or EEPROM, among others. Machine memory can also be another type of machine memory, such as a static or removable storage disk, static or removable solid-state memory, and/or any other type of persistent hardware-based memory. Fundamentally, there is no limitation on the type(s) of memory other than it be embodied in hardware. The machine-executable instructions compose software (e.g., firmware and/or application(s) or portion(s) thereof) that controls many aspects of notification system 704. In some embodiments, notification system 704 or portions thereof can be executed in a general computing system, an example of which is described below in connection with FIG. 8.

Referring still to FIG. 7, display 752 may be any suitable display observable or otherwise perceivable by a human operator, including but not limited to a graphical display, another type of visual display (e.g., one or more lights, dials, etc.), an aural display, and/or a haptic display, among others. When fault-indicating assembly 700 has been triggered, communication module 724 has sent notification signal 728, and communication module 740 has received the notification signal, processor 744 executes suitable software to cause display to display a notification that one or more observers can perceive so as to indicate to the observer(s) that the fault-indicating assembly has been triggered so as to alert the observer(s) that electrical device 108 may have experienced an internal fault. Similarly, when communication module 740 receives notification signal 728, processor 744 may also or alternatively execute suitable software that sends a suitable fault signal to one or more external systems (not shown) that are each configured to respond to the fault signal in a useful manner. Examples of such external systems include but are not limited to, power-distribution control systems, system-wide alert systems, broadcast alert systems, and network-wide fault-tracking systems, and critical event management systems, among others.

Example Computing System

It is to be noted that any one or more of the aspects and embodiments of notification system 704 of FIG. 7 described herein may be conveniently implemented in and/or using one or more machines (e.g., one or more computers, one or more communications network devices, one or more electrical distribution network devices, any combination and/or network thereof, among other things) programmed according to the teachings of the present specification, as will be apparent to those of ordinary skill in the computer arts. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, a laptop computer, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
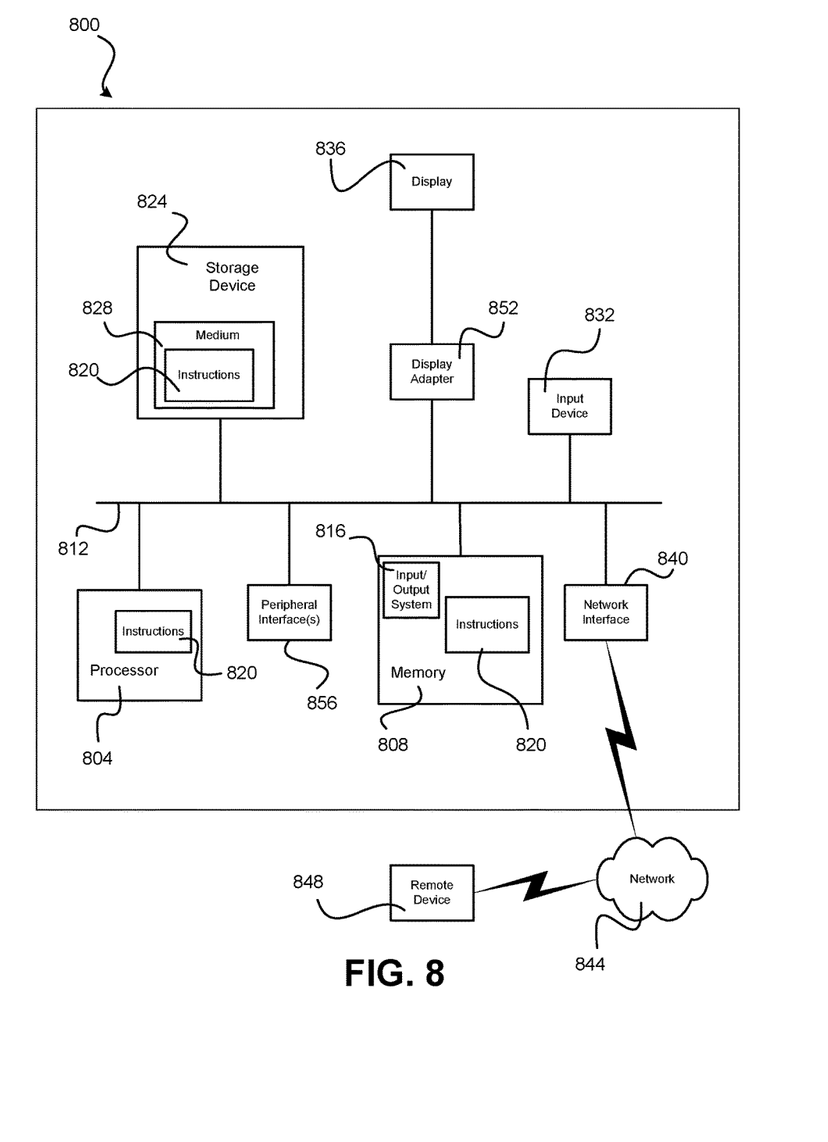
FIG. 8 is a high-level schematic diagram illustrating a computing system that can be incorporated into the notification system of FIG. 7.

FIG. 8 shows a diagrammatic representation of one embodiment of a computing device in the exemplary form of a computer system 800 within which a set of instructions for performing any one or more of the aspects and/or methodologies of the present disclosure may be executed. It is also contemplated that multiple computing devices may be utilized to implement a specially configured set of instructions for causing one or more of the devices to contain and/or perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Memory 808 may include various components (e.g., machine-readable media) including, but not limited to, a random access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the disclosure. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this disclosure. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present disclosure. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this disclosure.

Example embodiments have been disclosed above and illustrated in the accompanying drawings. It will be understood by those skilled in the art that various changes, omissions and additions may be made to that which is specifically disclosed herein without departing from the spirit and scope of the present disclosure.

What is claimed is:

1. A fault-indicator assembly for an electrical device that includes a housing defining an interior space that contains electrical components, wherein the housing includes an orifice in fluid communication with the interior space, and a fault within the electrical components causes a pressure rise within the interior space, the fault-indicator assembly comprising:
   a visual indicator changeable between a non-fault-indicating state and a fault-indicating state, wherein, once the visual indicator has changed from the non-fault-indicating state to the fault-indicating state due to increase in pressure within the interior space of the housing of the electrical device, the visual indicator remains in the fault-indicating state after the pressure has subsided;
   a pressure-activated actuator operatively coupled to the visual indicator, the pressure-activated actuator configured, when the fault-indicator assembly is deployed exteriorly to the electrical device, to cause the visual indicator to change to the fault-indicating state in response to an increase in pressure within the interior space of the electrical device equaling a preset pressure; and
   a connecting structure configured to locate the fault-indicator assembly exteriorly to the housing of the electrical device, the connecting structure having a fluid passageway that, when the fault-indicator assembly is deployed exteriorly to the electronic device, fluidly couples the pressure-activated actuator to the interior space of the electrical device via the orifice.

2. The fault-indicator assembly according to claim 1, wherein the visual indicator is movable between a non-fault-indicating position and a fault-indicating position and the fault-indicator assembly further comprises:
   a catch operatively engaged with the visual indicator, the catch maintaining the visual indicator in the non-fault-indicating position until triggered to release the visual indicator; and
   a trigger responsive to the pressure-activated actuator and operatively engaged with the catch so as to release the catch in response to the trigger being triggered by the pressure-activated actuator.

3. The fault-indicator assembly according to claim 2, wherein the visual indicator comprises an elongate body slidable within a mating receiver along a longitudinal axis between the non-fault-indicating position and the fault-indicating position.

4. The fault-indicator assembly according to claim 3, further comprising a biasing means that biases the plunger toward the fault-indicating position.

5. The fault-indicator assembly according to claim 4, wherein the biasing means comprises a compressed spring.

6. The fault-indicator assembly according to claim 4, wherein the mating receiver is at least partially defined by a wall, and the catch comprises a movable shear pin extending into each of a receiver of the elongate body and an aperture within the wall when the catch is holding the visual indicator in the non-fault-indicating position.

7. The fault-indicator assembly according to claim 6, wherein the trigger is configured to push the shear pin out of the aperture in the wall so as to release the visual indicator from the non-fault-indicating position.

8. The fault-indicator assembly according to claim 6, wherein the trigger comprises a threaded adjuster for adjusting the pressure at which the trigger releases the catch.

9. The fault-indicator assembly according to claim 2, wherein the pressure-activated actuator comprises a deformable body, wherein the trigger is coupled to the deformable body such that when the deformable body deforms with increasing pressure, the deformable body moves the trigger.

10. The fault-indicator assembly according to claim 9, wherein the deformable body comprises a bellows having an interior space in fluid communication with the interior space of the electrical device when the fault-indicator assembly is deployed exteriorly to the electrical device.

11. The fault-indicator assembly according to claim 1, wherein the orifice is a conventional pressure-relief-valve orifice, and the connecting structure comprises an end configured to sealingly engage the conventional pressure-relief-valve orifice.

12. The fault-indicator assembly according to claim 1, wherein the connecting structure comprises a pressure-relief valve.

13. The fault-indicator assembly according to claim 12, wherein the connecting structure has a fluid passageway that, when the fault-indicator assembly is deployed exteriorly to the electrical device, fluidly connects the interior space of the electrical device to each of the pressure-activated actuator and the pressure-relief valve.

14. The fault-indicator assembly according to claim 12, wherein the visual indicator is movable between a non-fault-indicating position and a fault-indicating position, the fault-indicator assembly further comprising a housing that houses each of pressure-activated actuator and at least a portion of the visual indicator when the visual indicator is in the non-fault-indicating position and that unifies the fault indicator and the pressure-relief valve into a single unit.

15. The fault-indicator assembly according to claim 12, wherein the pressure-relief valve is configured to release pressure within the connecting structure at a first pressure magnitude and the fault indicator assembly is configured to trigger the visual indicator at a second pressure magnitude lower than the first pressure magnitude.

16. The fault-indicator assembly according to claim 12, wherein the pressure-relief valve is configured to release pressure within the connecting structure at a first pressure magnitude and the fault indicator assembly is configured to trigger the visual indicator at a second pressure magnitude higher than the first pressure magnitude.

17. The fault-indicator assembly according to claim 1, further comprising a communication trigger and a communication module, wherein the communication trigger is configured to cause the communication module to transmit a notification signal to a communication network when the visual indicator has changed to the fault-indicating state.

18. A fault-indicator assembly for an electrical device that includes a housing defining an interior space that contains electrical components, wherein the housing includes an orifice in fluid communication with the interior space, and a fault within the electrical components causes an overpressure within the interior space, the fault-indicator assembly comprising:
   a visual indicator movable between a non-fault-indicating position and a fault-indicating position, wherein, once the visual indicator has moved from the non-fault-indicating position to the fault-indicating position due to increase in pressure within the interior space of the housing of the electrical device, the visual indicator remains in the fault-indicating position after the pressure has subsided;

a catch operatively engaged with the visual indicator, the catch maintaining the visual indicator in the non-fault-indicating position until triggered to release the visual indicator;

a trigger operatively engaged with the catch so as to release the catch in response to the trigger being triggered;

a pressure-activated actuator in operative communication with the trigger, the pressure-activated actuator configured to actuate the trigger, when the fault-indicator assembly is deployed on the electrical device, in response to an increase in pressure within the interior space of the electrical device;

a connecting structure configured to locate the fault-indicator assembly exteriorly to the housing of the electrical device, the connecting structure having a fluid passageway that, when the fault-indicator assembly is deployed with the electronic device, fluidly couples the pressure-activated actuator to the interior space of the electrical device via the orifice;

a pressure-relief valve in fluid communication with the connecting structure; and a housing that contains the pressure-activated actuator, the catch, the trigger, and, when the visual indicator is in the non-fault-indicating position, a portion of the visual indicator that is located outside of the housing when the visual indicator is in the fault-indicating position.

19. The fault-indicator assembly according to claim 18, further comprising a communication trigger and a communication module, wherein the communication trigger is configured to cause the communication module to transmit a notification signal to a communication network when the visual indicator has changed to the fault-indicating position.

20. A fault-indicator assembly for an electrical device that includes a housing defining an interior space that contains electrical components, wherein the housing includes an orifice in fluid communication with the interior space, and a fault within the electrical components causes a pressure rise within the interior space, the fault-indicator assembly comprising:

a communication module configured to transmit a notification signal to a network;

a communication trigger in operative communication with the communication module and configured to communicate one or more signals to the communication module that cause the communication module to transmit the notification signal in response to pressure within the interior space of the electrical device equaling or exceeding a trigger pressure of the fault-indicator assembly;

a pressure-activated actuator configured, when the fault-indicator assembly is deployed exteriorly to the electrical device, to cause the communication trigger to communicate the one or more signals to the communication module based on the pressure within the interior space of the electrical device equaling or exceeding the trigger pressure; and a connecting structure configured to locate the fault-indicator assembly exteriorly to the housing of the electrical device, the connecting structure having a fluid passageway that, when the fault-indicator assembly is deployed exteriorly to the electronic device, fluidly couples the pressure-activated actuator to the interior space of the electrical device via the orifice.

* * * * *